(12) United States Patent
Yang (10) Patent No.: US 10,502,496 B2
(45) Date of Patent: Dec. 10, 2019

(54) MICRO VAPOR CHAMBER

(75) Inventor: Hsiu-Wei Yang, Sinjhuang (TW)

(73) Assignee: ASIA VITAL COMPONENTS (CHINA) CO., LTD., Shenzhen (CN)

( * ) Notice: Subject to any disclaimer, the term of this patent is extended or adjusted under 35 U.S.C. 154(b) by 0 days.

(21) Appl. No.: 12/831,218

(22) Filed: Jul. 6, 2010

(65) Prior Publication Data

US 2011/0259555 A1    Oct. 27, 2011

(30) Foreign Application Priority Data

Apr. 26, 2010  (TW) ................................ 99207601 U (51) Int. Cl.
*F28D 15/02* (2006.01)
*F28D 15/04* (2006.01)
*H01L 23/427* (2006.01)

(52) U.S. Cl.
CPC ....... *F28D 15/0233* (2013.01); *F28D 15/046* (2013.01); *H01L 23/427* (2013.01); *H01L 2924/0002* (2013.01)

(58) Field of Classification Search
CPC .. F28D 15/0266; F28D 15/0233; F28D 15/04; F28D 15/046; F28D 15/02; F28D 2015/0225; B23P 15/26
USPC .......... 165/104.26, 104.21, 104.33; 361/700; 29/890.032
See application file for complete search history.

(56) References Cited

U.S. PATENT DOCUMENTS

| 3,525,670 | A  | * | 8/1970 | Brown | ................... F28D 15/06 |
|---|---|---|---|---|---|
| | | | | | 122/366 |
| 6,446,706 | B1 | * | 9/2002 | Rosenfeld | ........... F28D 15/0241 |
| | | | | | 165/104.26 |
| 6,863,117 | B2 | * | 3/2005 | Valenzuela | ......... F28D 15/0233 |
| | | | | | 165/104.21 |
| 6,957,692 | B1 | * | 10/2005 | Win-Haw et al. | ............ 361/700 |
| 7,775,261 | B2 | * | 8/2010 | Valenzuela | ........... F28D 15/043 |
| | | | | | 165/104.21 |
| 2002/0020518 | A1 | * | 2/2002 | Li | ....................... F28D 15/0233 |
| | | | | | 165/104.11 |
| 2004/0069460 | A1 | * | 4/2004 | Sasaki | ................ F28D 15/0241 |
| | | | | | 165/104.26 |
| 2006/0081360 | A1 | * | 4/2006 | Chen et al. | .............. 165/104.26 |
| 2006/0169439 | A1 | * | 8/2006 | Hong | ................... F28D 15/046 |
| | | | | | 165/104.26 |

(Continued)

*Primary Examiner* — Jianying C Atkisson
*Assistant Examiner* — Jose O Class-Quinones
(74) *Attorney, Agent, or Firm* — Jackson IPG PLLC; Demian K. Jackson (57) ABSTRACT

A micro vapor chamber includes: a first plate body having a first side and a second side, the second side having at least one condensation section; a second plate body having a third side and a fourth side, the third side being provided with at least one evaporation section and multiple flow collection sections, the third side being correspondingly mated with the second side of the first plate body, the fourth side contacting with at least one heat source; and a mesh structure body disposed between the first plate body and the second plate body. The mesh structure body is a capillary structure having multiple meshes and a first face and a second face. The first and second faces of the mesh structure body are mated with the condensation section and the evaporation section and the flow collection sections respectively to together define multiple flow ways.

17 Claims, 8 Drawing Sheets

(56) References Cited

U.S. PATENT DOCUMENTS

| | | | |
|---|---|---|---|
| 2007/0107875 A1* | 5/2007 | Lee | H01L 23/427 |
| | | | 165/104.26 |
| 2007/0240855 A1* | 10/2007 | Hou | F28D 15/046 |
| | | | 165/104.26 |
| 2007/0240858 A1* | 10/2007 | Hou | F28D 15/046 |
| | | | 165/104.26 |
| 2007/0294892 A1* | 12/2007 | Yang et al. | 29/890.032 |
| 2008/0210407 A1* | 9/2008 | Kim | F28D 15/0233 |
| | | | 165/104.26 |
| 2008/0283222 A1* | 11/2008 | Chang | H01L 23/427 |
| | | | 165/104.26 |
| 2009/0025910 A1* | 1/2009 | Hoffman | F28D 15/046 |
| | | | 165/104.26 |
| 2011/0253345 A1* | 10/2011 | Ryoson | F28D 15/0233 |
| | | | 165/104.26 |

* cited by examiner

MICRO VAPOR CHAMBER

This application claims the priority benefit of Taiwan patent application number 099207601 filed on Apr. 26, 2010.

FIELD OF THE INVENTION

The present invention relates generally to a micro vapor chamber, and more particularly to a slim micro vapor chamber.

BACKGROUND OF THE INVENTION

Currently, there is a trend toward having various electronic products slimmer and slimmer. To go with the trend, the electronic components, such as the semiconductor components, of the electronic products need to be considerably miniaturized. This leads to a problem of heat dissipation, which seriously affects the performance of the electronic equipments and systems.

To speak more specifically, the miniaturization of the semiconductor components results in increase of heat flux. The increase of heat flux challenges the cooling of an electronic product more than pure increase of total heat. This is because the increase of heat flux will lead to overheating at different times by different lengths and may cause malfunction of the electronic product.

A conventional vapor chamber (VC) heat spreader is disposed on a chip to serve as a heat sink. The vapor chamber heat spreader has an upper wall and a lower wall and a capillary wick structure sandwiched therebetween. The capillary wick structure has capillary copper coating or sintered copper pillars or blisters for supporting the upper and lower walls to form the backflow paths. However, the upper and lower walls of the vapor chamber heat spreader have a very thin thickness (under 1.5 mm). When applying the capillary wick structure to a micro heat spreader for supporting the upper and lower walls thereof, only those sections at the sintered copper pillars or blisters are supported. Under such circumstance, the remaining sections are likely to collapse or sink. As a result, the planarity and strength of the micro heat spreader will be deteriorated. In this case, it is hard to slim the micro heat spreader.

Moreover, it is critical to select a suitable wick structure for the vapor chamber heat spreader. The wick structure must be able to keep the flow speed of the condensed liquid and have sufficient capillary force to overcome gravity. According to the aforesaid, the conventional vapor chamber heat spreader has the following defects:

1. The conventional vapor chamber heat spreader is too thick.

2. The conventional vapor chamber heat spreader can be hardly slimmed.

SUMMARY OF THE INVENTION

A primary object of the present invention is to provide a slim micro vapor chamber.

A further object of the present invention is to provide the above micro vapor chamber, which is able to provide greatly enhanced heat transfer effect.

To achieve the above and other objects, the micro vapor chamber of the present invention includes: a first plate body having a first side and a second side, the second side having at least one condensation section; a second plate body having a third side and a fourth side, the third side being provided with at least one evaporation section and multiple flow collection sections, the third side being correspondingly mated with the second side of the first plate body, the fourth side contacting with at least one heat source; and a mesh structure body disposed between the first plate body and the second plate body. The mesh structure body is a capillary structure having multiple meshes and a first face and a second face. The first and second faces of the mesh structure body are mated with the condensation section and the evaporation section and the flow collection sections respectively to together define multiple flow ways. A condensed working fluid can flow back to the evaporation section through the capillary structure. The condensation section, the mesh structure body and the evaporation section and the flow collection sections together cooperatively form a slim micro heat spreader with excellent heat transfer effect. The present invention has the following advantages:

1. The micro vapor chamber of the present invention is simplified.

2. The micro vapor chamber of the present invention is slim.

3. The micro vapor chamber of the present invention has higher heat transfer efficiency.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Please refer to FIGS. 1, 2, 3a and 3b. According to a first embodiment, the micro vapor chamber 1 of the present invention includes a first plate body 11, a second plate body 12 and a mesh structure body 13.

The first plate body 11 has a first side 111 and a second side 112. The second side 112 has at least one condensation section 113.

The condensation section 113 has multiple ribs 114 defining therebetween multiple first grooves 115. The first grooves 115 transversely and longitudinally intersect each other.

The second plate body 12 has a third side 121 and a fourth side 122. The third side 121 is provided with at least one evaporation section 123 and multiple flow collection sections 124. The third side 121 is correspondingly mated with the second side 112 of the first plate body 11. The fourth side 122 contacts with at least one heat source 2.

The flow collection sections 124 include a first flow collection section 1241, a second flow collection section 1242, a third flow collection section 1243 and a fourth flow collection section 1244. The flow collection sections 124 are formed of multiple second grooves 125 deployed in a geometric pattern. The geometric pattern of the first, second, third and fourth flow collection sections 1241, 1242, 1243, 1244 is selected from the group consisting of square, circle, triangle and trapezoid. In this embodiment, the first flow collection section 1241 is deployed in a triangular pattern. The second flow collection section 1242 is deployed in a square pattern. The third flow collection section 1243 is deployed in a circular pattern. The fourth flow collection section 1244 is deployed in a trapezoidal pattern. The geometric patterns of the flow collection sections 124 are interchangeable with each other without limitation.

The evaporation section 123 is disposed on the third side 121 opposite to the heat source 2. The second grooves 125 of the evaporation section 123 have a width narrower than that of the second grooves 125 of the first, second, third and fourth flow collection sections 1241, 1242, 1243, 1244.

The mesh structure body 13 is disposed between the first plate body 11 and the second plate body 12. The mesh structure body 13 is a capillary structure having multiple meshes 131 and a first face 132 and a second face 133. The first and second faces 132, 133 of the mesh structure body 13 are mated with the condensation section 113 and the evaporation section 123 and the flow collection sections 124 respectively to together define multiple flow ways 126. A working fluid 3 is contained in the flow ways 126. The working fluid 3 is selected from the group consisting of pure water, methanol, acetone, coolant and ammonia.

The first and second faces 132, 133 of the mesh structure body 13 are mated with the condensation section 113 and the evaporation section 123 and the flow collection sections 124 by means of diffusion bonding.

Figure 1:
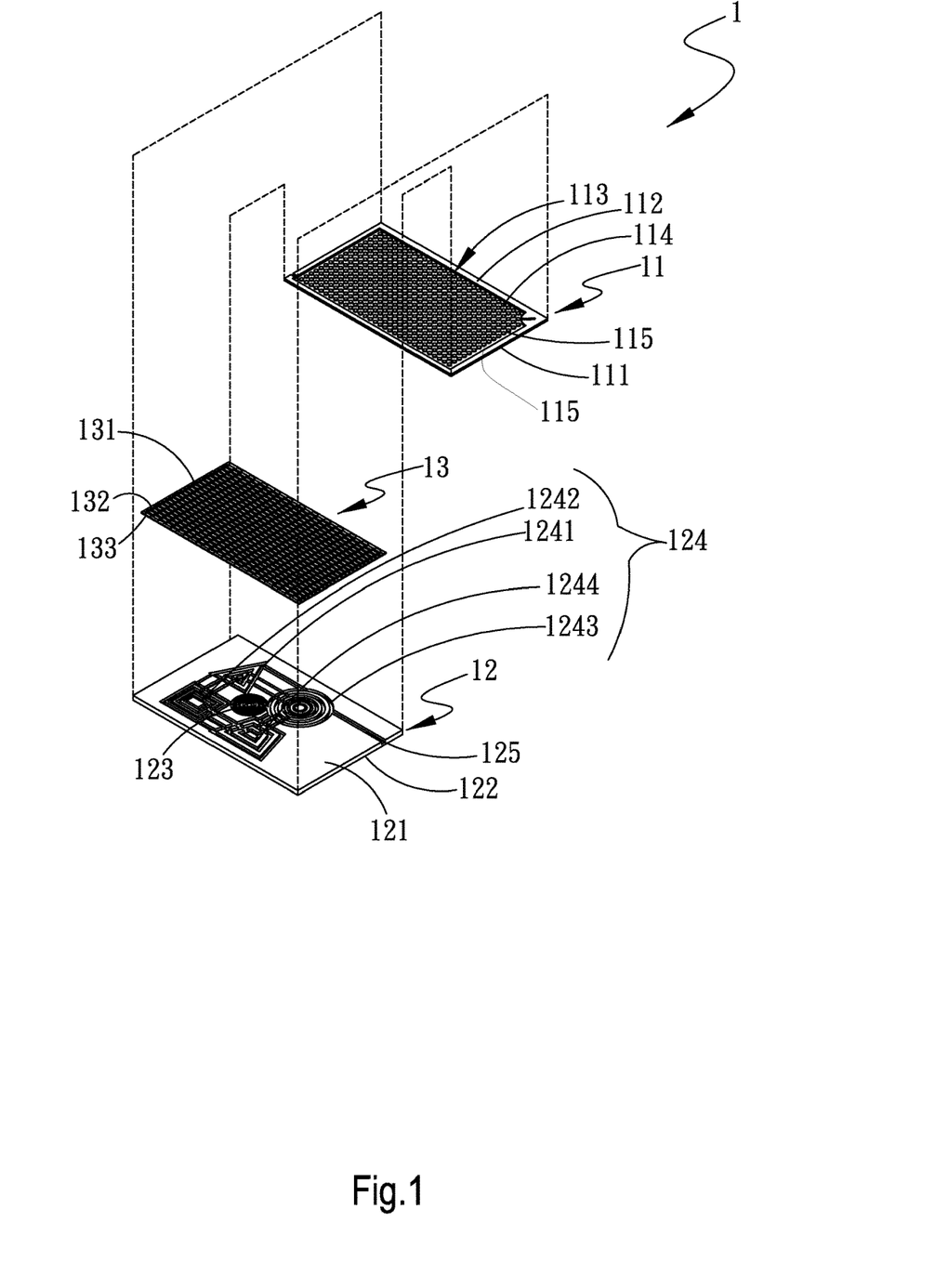
FIG. 1 is a perspective exploded view of the micro heat spreader of the present invention.
Figure 2:
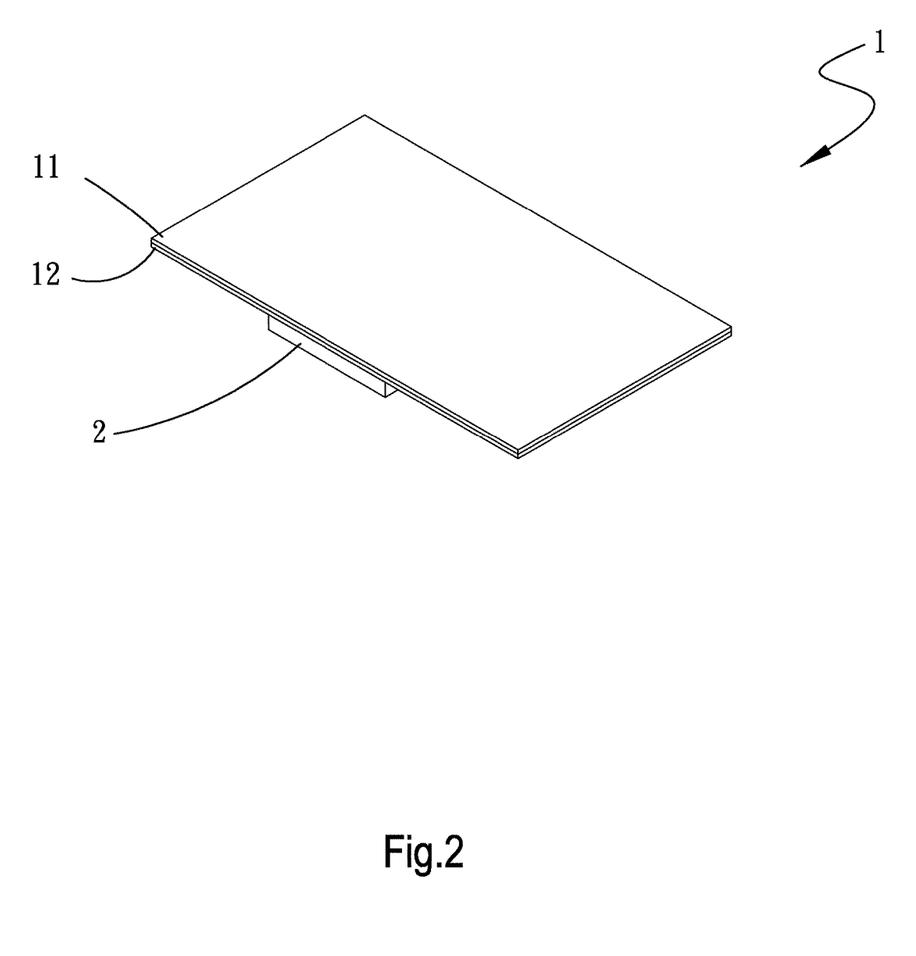
FIG. 2 is a perspective assembled view of the micro heat spreader of the present invention.
Figure 3A:
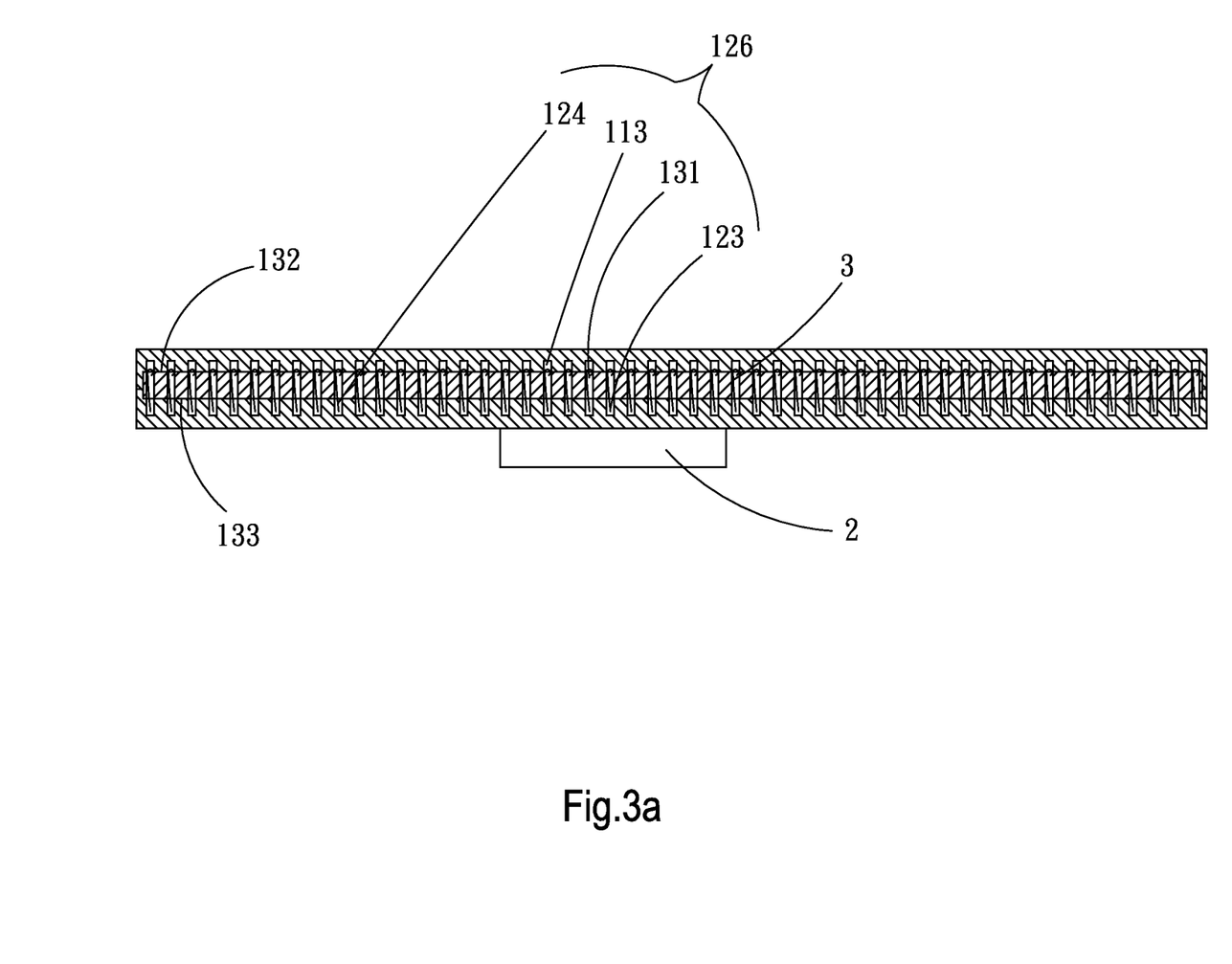
FIG. 3a is a sectional view of the micro heat spreader of the present invention.
Figure 3B:
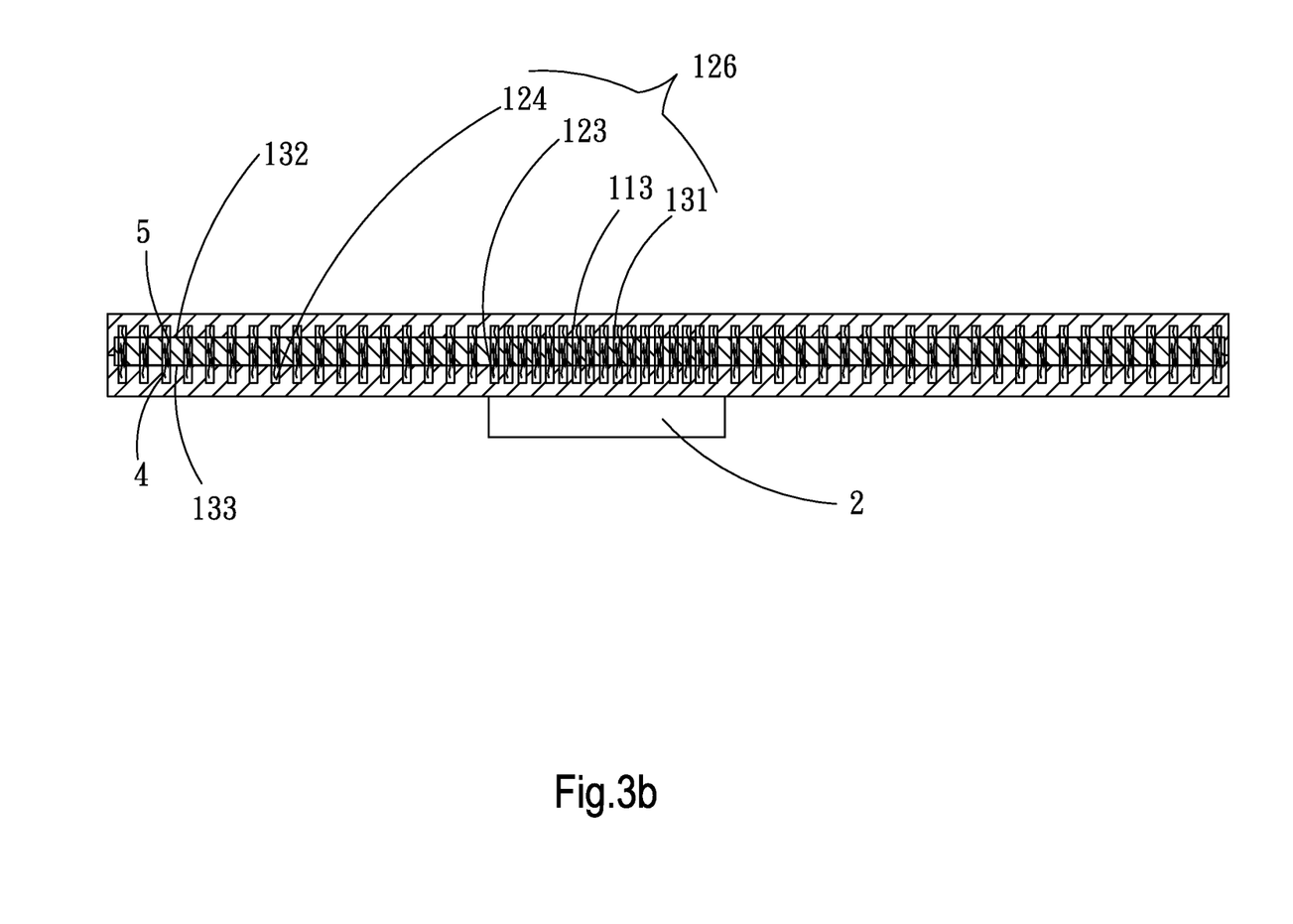
FIG. 3b is a sectional view of another embodiment of the micro heat spreader of the present invention.
Figure 4:
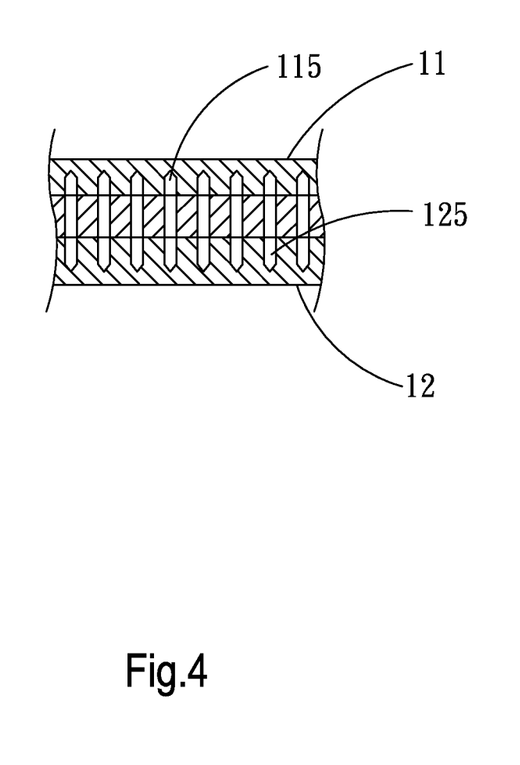
FIG. 4 is a sectional view of a part of the micro heat spreader of the present invention.
Figure 5:
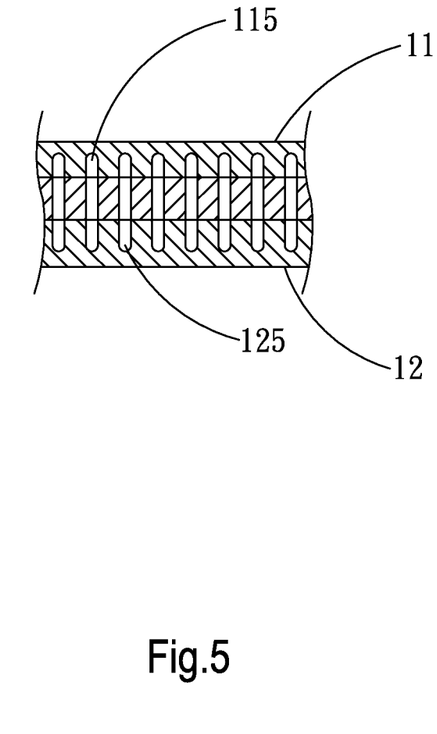
FIG. 5 is a sectional view of a part of the micro heat spreader of the present invention.

Please refer to FIGS. 1, 2, 3a, 3b, 4 and 5. The bottoms of the first grooves 115 of the first plate body 11 are V-shaped (as shown in FIG. 4) or U-shaped (as shown in FIG. 5) or rectangular (as shown in FIG. 3a). The shapes of the bottoms of the first grooves 115 can be selectively alternated between each other without limitation.

The first and second plate bodies 11, 12 are made of copper material or aluminum material.

The bottoms of the second grooves 125 of the second plate body 12 are V-shaped (as shown in FIG. 4) or U-shaped (as shown in FIG. 5) or rectangular (as shown in FIG. 3a). The shapes of the bottoms of the first grooves 115 can be selectively alternated between each other without limitation.

According to the above arrangement, the fourth side 122 of the second plate body 12 contacts with the heat source 2 for conducting heat. When the heat is transferred from the fourth side 122 of the second plate body 12 to the evaporation section 123 of the third side 121 of the second plate body 12, the working fluid 4 will evaporate and spread to the condensation section 113. After the vaporized working fluid 4 is transformed into liquid working fluid 5 in the condensation section 113, the liquid working fluid 5 will flow back to the evaporation section 123 through the second grooves 125 of the first, second, third and fourth flow collection sections 1241, 1242, 1243, 1244 of the second plate body 12 by the capillary force of the meshes 131 of the mesh structure body 13. Accordingly, a thermal cycle is completed.

Figure 6:
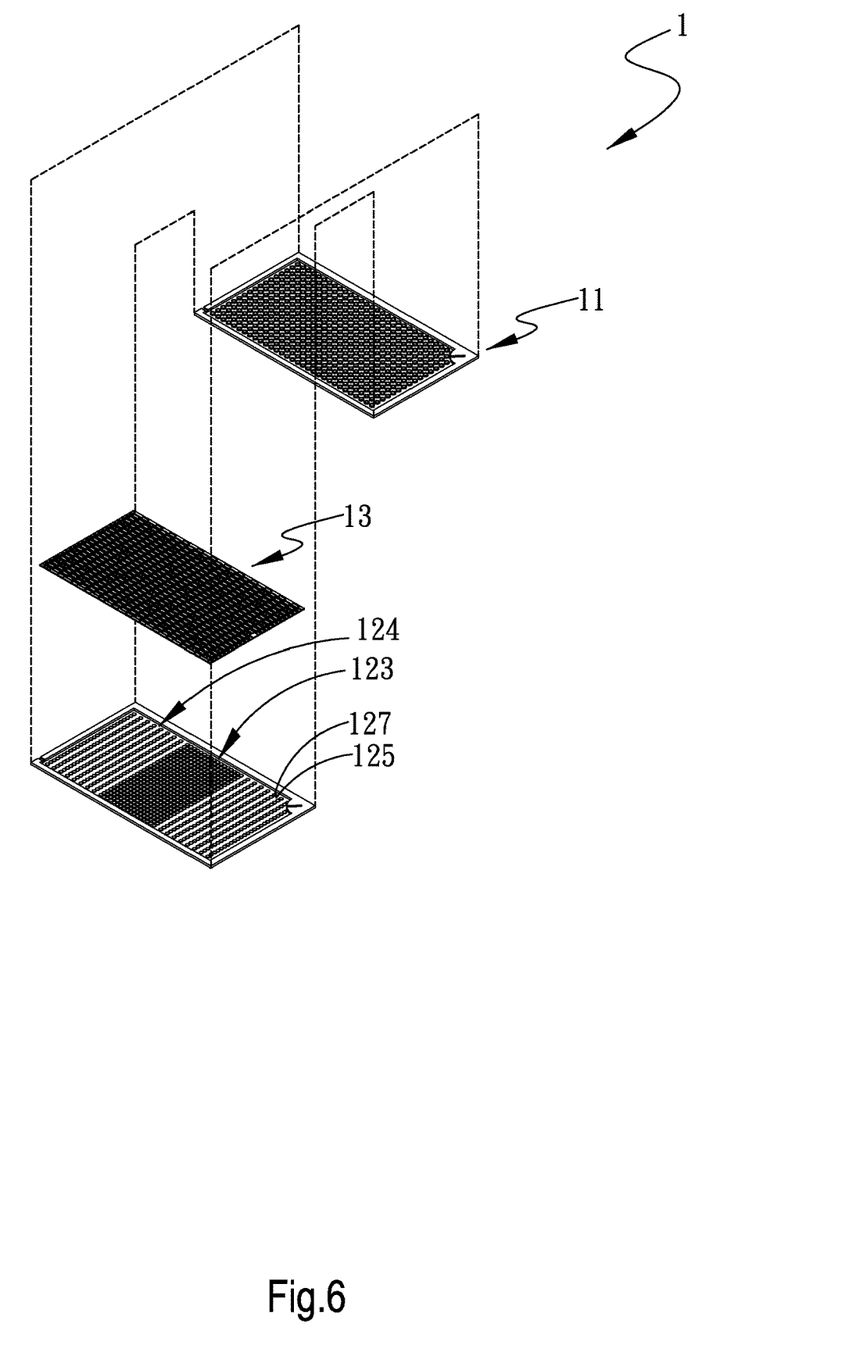
FIG. 6 is a perspective exploded view of another embodiment of the micro heat spreader of the present invention.

Please refer to FIG. 6, which is a perspective exploded view of another embodiment of the micro-heat spreader of the present invention. The first plate body 11 and the mesh structure body 13 of this embodiment are identical to those of the above embodiment and thus will not be repeatedly described hereinafter. The evaporation section 123 and the flow collection sections 124 of the second plate body 12 have multiple ribs 127 defining therebetween multiple second grooves 125. The second grooves 125 transversely and longitudinally intersect each other.

Figure 7:
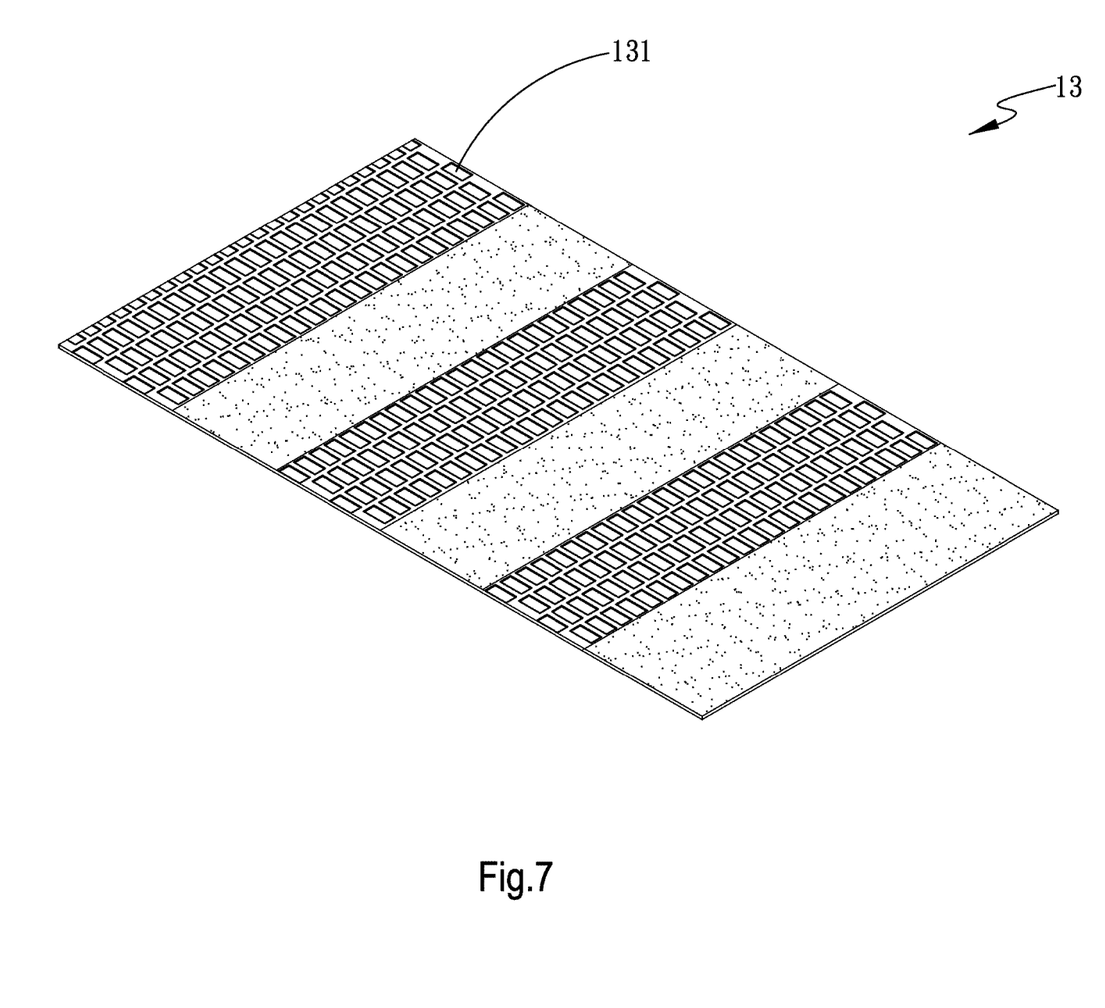
FIG. 7 is an enlarged perspective view showing the complex nature of the mesh structure body of the micro heat spreader of the present invention.

In addition, the meshes 131 of the mesh structure body 13 have equal or unequal sizes. That is, the mesh structure body 13 can have cooperative large and small (coarse and fine) meshes 131. In the condition that the micro heat spreader has a uniform total thickness, there are four 200-mesh layers on the evaporation section 123 and two 100-mesh layers (not shown) on the other sections. Moreover, the mesh structure body 13 can be a complex structure of cooperative sintered body and mesh structure as shown in FIG. 7. That is, the mesh structure body 13 can be previously bored and then supplemented with sintered layers in the bores. Therefore, in the precondition that the total thickness of the micro heat spreader is not increased, the structure of the micro heat spreader can be freely modified as necessary.

The above embodiments are only used to illustrate the present invention, not intended to limit the scope thereof. It is understood that many changes and modifications of the above embodiments can be made without departing from the spirit of the present invention. The scope of the present invention is limited only by the appended claims.

What is claimed is:

1. A micro vapor chamber comprising:
   a first plate body located at an upper side and having a first side and a second side having at least one condensation section with multiple ribs defining therebetween multiple first grooves transversely and longitudinally intersecting each other thereby separating the ribs from each other;
   a second plate body located at a lower side and having a third side and a fourth side, the third side being provided with an evaporation section and multiple flow collection sections, the evaporation section and the flow collection sections being formed of multiple second grooves, the third side being correspondingly mated with the second side of the first plate body, the fourth side contacting at least one heat source, wherein all of the second grooves of the evaporation section have a width narrower than that of all of the second grooves of the flow collection sections; and
   a mesh structure body disposed between the first plate body and the second plate body, the mesh structure body being a capillary structure having multiple meshes and a first face and a second face mated with the condensation section and the evaporation section and the flow collection sections, respectively, to together define multiple flow ways; and wherein each of the multiple ribs is an independent structure having a first end abutted against the mesh structure body, so that a working fluid contained in the flow ways is condensed and collected at the first ends of the multiple ribs and, by means of the capillary force in the mesh structure body, flows back to the evaporation section of the second plate body.

2. The micro vapor chamber as claimed in claim 1, wherein the flow collection sections include a first flow collection section, a second flow collection section, a third flow collection section and a fourth flow collection section, the first, second, third, and fourth flow collection sections and the evaporation section being formed of the multiple second grooves deployed in multiple different geometric patterns.

3. The micro vapor chamber as claimed in claim 2, wherein the geometric pattern of the first flow collection section is selected from the group consisting of square, circle, triangle and trapezoid.

4. The micro vapor chamber as claimed in claim 2, wherein the geometric pattern of the second flow collection section is selected from the group consisting of square, circle, triangle and trapezoid.

5. The micro vapor chamber as claimed in claim 2, wherein the geometric pattern of the third flow collection section is selected from the group consisting of square, circle, triangle and trapezoid.

6. The micro vapor chamber as claimed in claim 2, wherein the geometric pattern of the fourth flow collection section is selected from the group consisting of square, circle, triangle and trapezoid.

7. The micro vapor chamber as claimed in claim 2, wherein bottoms of the second grooves of the first, second, third and fourth flow collection sections are V-shaped, U-shaped or rectangular.

8. The micro vapor chamber as claimed in claim 1, wherein the working fluid is selected from the group consisting of pure water, methanol, acetone, coolant, and ammonia.

9. The micro vapor chamber as claimed in claim 1, wherein bottoms of the first grooves of the condensation section are V-shaped, U-shaped or rectangular.

10. The micro vapor chamber as claimed in claim 1, wherein the first and second plate bodies are made of copper material or aluminum material.

11. The micro vapor chamber as claimed in claim 1, wherein the evaporation section and the flow collection sections have multiple ribs defining therebetween the multiple second grooves, the second grooves transversely and longitudinally intersecting each other.

12. The micro vapor chamber as claimed in claim 1, wherein the first and second faces of the mesh structure body are mated with the condensation section and the evaporation section and the flow collection sections by means of diffusion bonding.

13. The micro vapor chamber as claimed in claim 1, wherein the meshes of the mesh structure body have equal sizes.

14. The micro vapor chamber as claimed in claim 1, wherein the mesh structure body is a cooperative sintered body and mesh structure.

15. The micro vapor chamber of claim 2, wherein each of the first, second, third and fourth flow collection sections are each formed having a different geometric pattern selected from the group consisting of square, circle, triangle and trapezoid.

16. The micro vapor chamber of claim 1, wherein the evaporation section is centrally arranged and wherein the multiple flow collection sections are arranged about the evaporation section.

17. The micro vapor chamber of claim 1, wherein the meshes of the mesh structure body have unequal sizes.

* * * * *